United States Patent [19]

Inaba et al.

[11] Patent Number: 5,408,052
[45] Date of Patent: Apr. 18, 1995

[54] FLEXIBLE MULTI-LAYER CIRCUIT WIRING BOARD

[75] Inventors: Masaichi Inaba; Atsushi Miyagawa; Takeshi Iwayama, all of Ushiku, Japan

[73] Assignee: Nippon Mektron, Ltd., Tokyo, Japan

[21] Appl. No.: 117,150

[22] PCT Filed: Jan. 12, 1993

[86] PCT No.: PCT/JP93/00029
§ 371 Date: Sep. 13, 1993
§ 102(e) Date: Sep. 13, 1993

[87] PCT Pub. No.: WO93/15520
PCT Pub. Date: Aug. 5, 1993

[30] Foreign Application Priority Data

Jan. 24, 1992 [JP] Japan .................................. 4-034489

[51] Int. Cl.6 .............................................. H05R 1/02
[52] U.S. Cl. .................................. 174/261; 174/254; 361/774
[58] Field of Search ................ 174/254, 261; 361/749, 361/772, 773, 774, 789, 792; 439/77

[56] References Cited

U.S. PATENT DOCUMENTS

| | | | |
|---|---|---|---|
| 4,858,073 | 8/1989 | Gregory | 361/388 |
| 4,949,225 | 8/1990 | Sagisaka | 361/414 |
| 5,057,907 | 10/1991 | Ooi et al. | 257/678 |

*Primary Examiner*—Leo P. Picard
*Assistant Examiner*—L. Thomas
*Attorney, Agent, or Firm*—Chilton, Alix & Van Kirk

[57] ABSTRACT

A flexible multi-layer circuit wiring board which is capable of constituting finger lead-like terminals that are little liable to be deformed even when the circuit conductors protruding like finger leads are finely formed and is capable of maintaining good flexibility at a bent portion. Circuit conductors 2 composed of an electrically conducting metal having a large Young's modulus are disposed at the ends of one surface of a flexible insulating base member 1 to form finger lead-like terminals 3, required circuit wiring conductors 4 composed of an electrically conducting metal rich in flexibility are disposed on the other surface of the flexible insulating base member 1 inclusive of a bent portion A of the circuit wiring board, and through-hole connection portions 5 are formed to electrically connect required portions of the circuit conductors 2 and the circuit wiring conductors 4.

12 Claims, 2 Drawing Sheets

FLEXIBLE MULTI-LAYER CIRCUIT WIRING BOARD

TECHNICAL FIELD

The present invention relates to a flexible circuit wiring board and, particularly, to a flexible multi-layer circuit wiring board having circuit conductors which form finger lead terminals which extend outwardly from edge regions of the board.

BACKGROUND ART

It is known in the art for a flexible circuit wiring board have circuit wiring conductors outwardly protruding in the form of finger leads. An example of such a prior art circuit board is shown in FIGS. 3 and 4. In the circuit board of FIGS. 3 and 4, the protruding circuit wiring conductors 11 are composed of rolled copper or electrolytic copper and may be called TAB leads. These TAB leads extend beyond the edge of an aperture or window 12 that is formed in a flexible insulating base member 13 for connection to a device, i.e., an electrical circuit component.

In the above-mentioned flexible circuit wiring board of conventional structure, the circuit wiring conductors 11 must be so strong that the inner leads protruding into the aperture 12 will not be easily deformed. Because of this reason, it is not allowed to finely form the circuit wiring conductors 11 i.e., high contact density is not possible.

In order to solve such a problem, it can be contrived to form the circuit wiring conductors 11 using an indium-copper alloy or the like instead of a traditional material such as rolled copper or electrolytic copper. This method, however, is not desirable since it impairs flexibility of the flexible circuit wiring board.

DISCLOSURE OF THE INVENTION

The present invention provides a flexible multi-layer circuit wiring board characterized by finger lead-like terminals which resist unintended deformation, even when the associated conductors of the board are finely formed and the board is capable of maintaining good flexibility, even at bent portions.

In a flexible multi-layer circuit wiring board according to the present invention, conductive members comprised of an electrically conducting metal having a large Young's modulus are disposed on one surface of a flexible insulating base member adjacent an edge region of the base member so as to form finger lead-like terminals. The required circuit wiring conductors of the circuit, comprised of a highly flexible and electrically conducting metal, are disposed on the other surface of the flexible and insulating base member. These wiring conductors extend along the base member in regions where there are no terminal forming conductive members, including regions where the circuit wiring board is bent to form a radius. Through hole electric connections are formed to electrically connect required portions of the terminal defining conductive members and the circuit wiring conductors.

The circuit conductors for forming the finger lead-like terminals are disposed on the portions of the circuit wiring board other than the bent portion thereof.

BEST MODE FOR CARRYING OUT THE INVENTION

Figure 1:
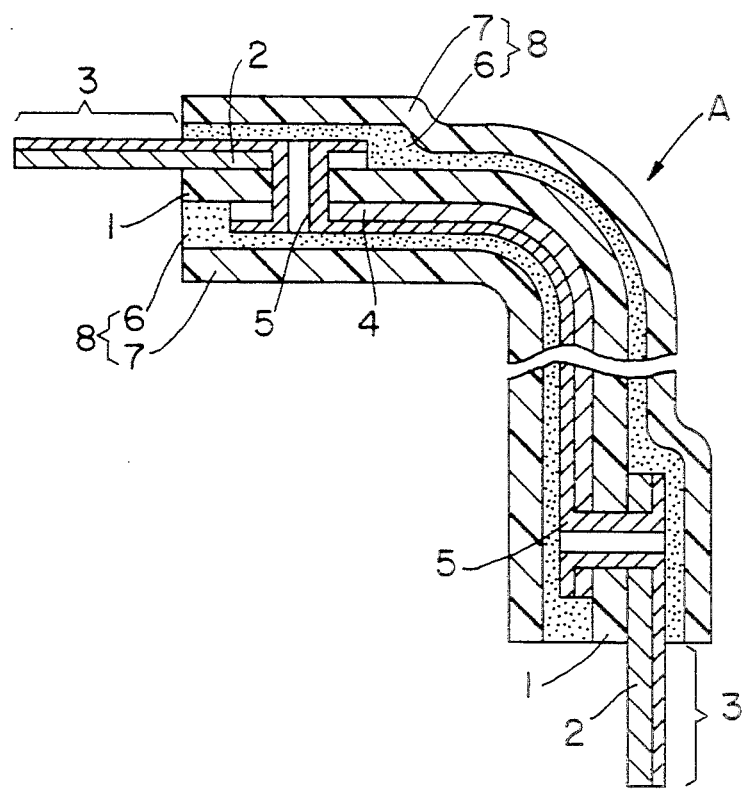
FIG. 1 is a sectional view which schematically illustrates major portions of a flexible multi-layer circuit wiring board in accordance with an embodiment of the present invention.
Figure 2:
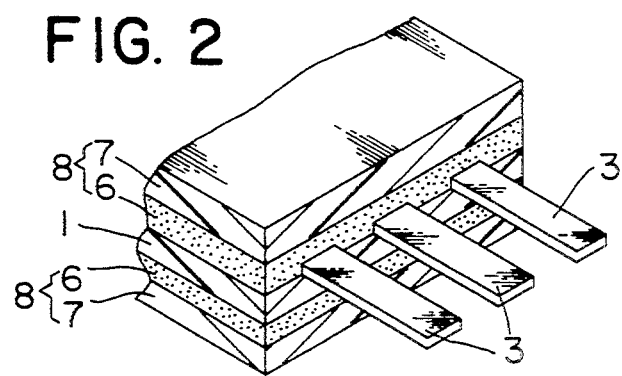
FIG. 2 is a perspective view which schematically illustrates the finger lead-like terminals of the circuit board of FIG. 1.

FIG. 1 is a sectional view which schematically illustrates major portions of a flexible multi-layer circuit wiring board constituted according to an embodiment of the present invention, and FIG. 2 is a perspective view of finger lead-like terminals.

In these drawings, reference numeral 1 denotes a flexible and insulating base member of a polyimide film or the like, and reference numeral 2 denotes a required number of circuit conductors made of an electrically conducting metal having a large Young's modulus such as an indium-copper alloy or the like. The conductors 2 are supported on one surface of base member 1 and partly protrude beyond the ends of the flexible insulating base member 1 to constitute finger lead-like terminals 3.

Figure 3:
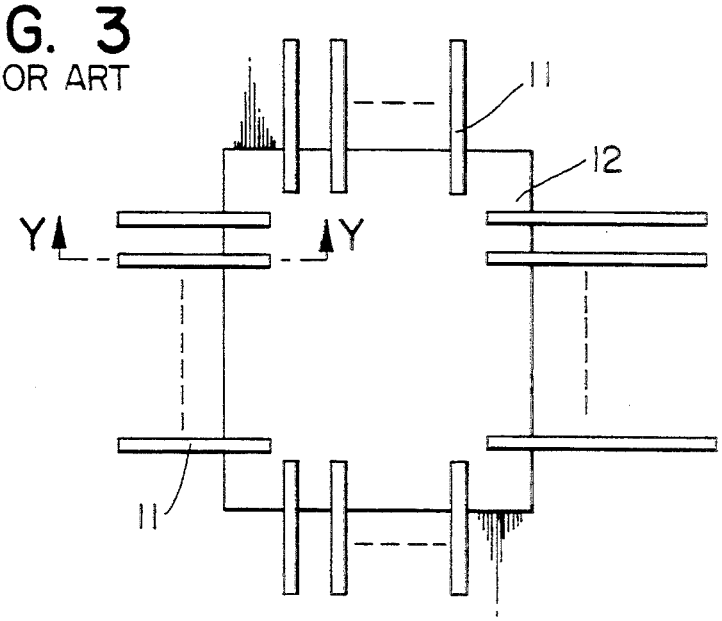
FIG. 3 is a top plan view which depicts the prior art.
Figure 4:
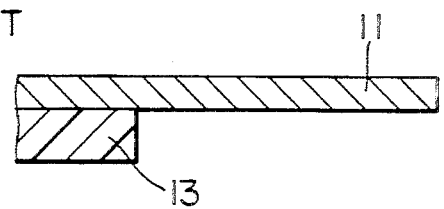
FIG. 4 is a cross-sectional side elevation view of a prior art circuit board taken along line Y—Y of FIG. 3.

In the disclosed embodiment the finger lead-like terminals 3 are formed at both ends of the circuit board but do not extend along the board to the region of the bent portion A of the board. In addition to being present at the ends of the circuit board, the finger lead-like terminals 3 can be formed at any position, extending into an aperture as shown in FIG. 3 for example, depending upon the specifications such as at one end of the circuit board except the bent portion A.

On the opposite surface of the flexible insulating base member 1 are formed a required number of circuit wiring conductors 4 composed of an electrically conducting metal having excellent flexibility such as rolled copper or the like to serve as circuit wiring patterns. The circuit wiring conductors 4 and the circuit conductors 2 constituting the finger lead-like terminals 3 are electrically connected together at predetermined portions by through-hole connection portions 5, thereby to form a required circuit.

On the surfaces of the circuit conductors 2 and the circuit wiring conductors 4, inclusive of those of the bent portion A, a surface protection layer 8 is formed. Protective layer 8 is comprised of an adhesive layer 6 and a flexible insulating film 7 composed of a suitable synthetic resin film such as a polyimide film.

The above-mentioned embodiment has dealt with a flexible multi-layer circuit wiring board having two circuit wiring layers, i.e., circuit conductors 2 and circuit wiring conductors 4. It is, however, also allowable to similarly obtain a flexible multi-layer circuit wiring board having more circuit wiring layers, as required, based upon a widely employed method yet having the finger lead-like terminals 3 formed in a manner as described above.

INDUSTRIAL APPLICABILITY

According to the flexible multi-layer circuit wiring board of the present invention, circuit conductors composed of an electrically conducting metal having a large Young's modulus are formed on one surface on the flexible insulating base member in order to form finger lead-like terminals at portions of the circuit wiring board other than the bent portion thereof, and required circuit wiring conductors composed of an electrically conducting metal having excellent flexibility are formed on the other surface of the flexible insulating base member inclusive of the bent portion. Therefore, the finger lead-like terminals can be formed in fine shapes maintaining an increased strength which is little liable to be deformed.

On the bent portion of the circuit wiring board are arranged circuit wiring conductors composed of an electrically conducting metal having excellent flexibility, making it possible to favorably maintain flexibility at the bent portion.

We claim:

1. A flexible circuit wiring board comprising:
a flexible insulating base member, said base member having a pair of opposite surfaces, said base member further having plural sides which extend between said surfaces;
a plurality of conductive members disposed on a first surface of said base member in a region adjacent at least a first side thereof, said conductive members extending outward from said base member beyond the junction of said first side and surface to form finger lead-like terminals, said conductive members being comprised of an electrically conductive metal having a large Young's modulus;
plural circuit wiring conductors disposed on the second of said surfaces of said base member, said conductors being comprised of an electrically conductive metal having a modulus of elasticity which is less than said large Young's modulus whereby said base member and conductors may be bent as a unit without frcturing, said conductors extending from said edge region along said base member whereby said conductors and conductive members are in registration only in said edge region; and
means establishing electrical connections through said base member between said conductive members and selected individual of said conductors, said connection establishing means including through-hole conductors on said base member.

2. The circuit board of claim 1 wherein said base member and said conductors disposed thereon are bent about a radius and wherein said edge region of said base member in which said conductive members are disposed is located outside of the portion of said base member which is bent.

3. The circuit board of claim 1 wherein said sides define at least a first aperture in said base member.

4. The circuit board of claim 1 wherein said conductive members are comprised of an indium-copper alloy.

5. The circuit board of claim 1 further comprising:
at least a first protective layer adhesively bonded to said second side of said base member so as to overlay said conductors and connection establishing means.

6. The circuit board of claim 5 further comprising:
a second protective layer adhesively bonded to said first surface of said base member so as to overlay said conductive members in at least said edge region.

7. The circuit board of claim 1 wherein said conductive members are disposed in a pair of displaced edge regions of said base member so as to extend beyond a pair of sides of said base member and wherein at least some of said circuit conductors on said base member extend between said edge regions.

8. The circuit board of claim 6 wherein said conductive members are disposed in a pair of displaced edge regions of said base member so as to extend beyond a pair of sides of said base member and wherein at least some of said circuit conductors on said base member extend between said edge regions.

9. The circuit board of claim 8 wherein said conductive members are comprised of an indium-copper alloy.

10. The circuit board of claim 7 wherein said base member and said conductors disposed thereon are bent about a radius and wherein said edge regions of said base member in which said conductive members are disposed is located outside of the portion of said base member which is bent.

11. The circuit board of claim 10 further comprising:
at least a first protective layer adhesively bonded to said second side of said base member so as to overlay said conductors and connection establishing means.

12. The circuit board of claim 11 further comprising:
a second protective layer adhesively bonded to said first surface of said base member so as to overlay said conductive members in at least said edge region.

* * * * *